US009923328B2

(12) United States Patent
Murakami et al.

(10) Patent No.: US 9,923,328 B2
(45) Date of Patent: Mar. 20, 2018

(54) OPTICAL FIBER COOLING DEVICE AND LASER OSCILLATOR

(71) Applicant: Mitsuboshi Diamond Industrial Co., LTD., Settsu, Osaka (JP)

(72) Inventors: Masanao Murakami, Settsu (JP); Christian Schaefer, Settsu (JP)

(73) Assignee: Mitsuboshi Diamond Industrial Co., LTD., Osaka (JP)

( * ) Notice: Subject to any disclaimer, the term of this patent is extended or adjusted under 35 U.S.C. 154(b) by 0 days.

(21) Appl. No.: 15/328,485

(22) PCT Filed: Jul. 15, 2015

(86) PCT No.: PCT/JP2015/070291
§ 371 (c)(1),
(2) Date: Jan. 24, 2017

(87) PCT Pub. No.: WO2016/013468
PCT Pub. Date: Jan. 28, 2016

(65) Prior Publication Data
US 2017/0214208 A1 Jul. 27, 2017

(30) Foreign Application Priority Data

Jul. 25, 2014 (JP) .................................. 2014-152012

(51) Int. Cl.
*H01S 3/30* (2006.01)
*H01S 3/04* (2006.01)
(Continued)

(52) U.S. Cl.
CPC .......... *H01S 3/0405* (2013.01); *G02B 6/4269* (2013.01); *G02B 7/20* (2013.01);
(Continued)

(58) Field of Classification Search
CPC ...... H01S 3/0405; H01S 3/067; H01S 3/0407; H01S 5/146; H01S 3/06704; G02B 7/20; G02B 6/4269
See application file for complete search history.

(56) References Cited

U.S. PATENT DOCUMENTS

| 2003/0081640 A1* | 5/2003 | Joyce | G02B 6/4248 372/36 |
| 2013/0235449 A1* | 9/2013 | Suzuki | H01S 3/0405 359/341.1 |

FOREIGN PATENT DOCUMENTS

| JP | 04361210 A | * 12/1992 | ........... G02B 6/4226 |
| JP | 2010182726 A | * 8/2010 | ............ H01S 3/042 |
| JP | 2012-023274 A | 2/2012 | |

OTHER PUBLICATIONS

The Search Report from the corresponding International Patent Application No. PCT/JP2015/070291 dated Oct. 6, 2015.

* cited by examiner

*Primary Examiner* — Yuanda Zhang
(74) *Attorney, Agent, or Firm* — Shinjyu Global IP

(57) ABSTRACT

A cooling device that enables the tip position of optical fiber to be adjusted and is able to efficiently cool an entirely of the optical fiber. This cooling device is provided with a cooling base plate, a fiber holder and an adjustment member. The cooling base plate has a recessed accommodating part. The fiber holder is disposed in the recessed accommodating part so as to be freely movable in a first direction. The adjustment member is disposed in a gap between the fiber holder and an end face of the recessed accommodating part and is movable in the first direction by moving in a second direction that intersects the first direction. The adjustment member abuts against both the end face of the recessed accommodating part and an end face of the fiber holder.

6 Claims, 5 Drawing Sheets

(51) Int. Cl.
*H01S 3/067* (2006.01)
*H01S 5/14* (2006.01)
*G02B 7/20* (2006.01)
*G02B 6/42* (2006.01)

(52) U.S. Cl.
CPC ............ *H01S 3/0407* (2013.01); *H01S 3/067* (2013.01); *H01S 3/06704* (2013.01); *H01S 5/146* (2013.01)

OPTICAL FIBER COOLING DEVICE AND LASER OSCILLATOR

PRIORITY

This is a National Stage Application under 35 U.S.C. § 365 of International Application PCT/JP2015/070291, with an international filing date of Jul. 15, 2015, which claims priority to Japanese Patent Application No. 2014-152012 filed on Jul. 25, 2014. The entire disclosures of International Application PCT/JP2015/070291 and Japanese Patent Application No. 2014-152012 are hereby incorporated herein by reference.

TECHNICAL FIELD

Certain implementations of the present invention relate to an optical fiber cooling device and a laser oscillator having the same.

BACKGROUND

Laser oscillators utilizing optical fiber are widely used. These laser oscillators utilize excitation light that is oscillated by a light source and oscillate laser light using optical fiber. The optical fiber that is used in these laser oscillators is formed by fluoride glass such as ZBLAN glass doped with a laser active material such as erbium, for example.

Here, the laser active material that is included in the optical fiber generates heat due to absorbing excitation light, possibly resulting in the optical fiber being damaged by the generated heat. In particular, fluoride fiber has low heat resistance compared with quartz fiber.

In view of this, a cooling device for cooling the optical fiber has been proposed. A metal heat dissipation member is used to bring the optical fiber in close contact with the surface of a heat sink that is cooled by a coolant. The metal heat dissipation member is formed as a thin film having tackiness, and is provided so as to cover an entirely of the optical fiber.

SUMMARY

Generally, optical fiber for laser has a non-uniform length. On the other hand, the central axis and the distance between the tip of the optical fiber and a lens need to be correctly positioned, in order to efficiently introduce excitation light to the optical fiber.

In view of this, a configuration is adopted in which a holder that holds the tip part of the optical fiber is moveable along an optical axis, and the holder is fixed after correctly positioning the distance between the lens and the tip of the optical fiber.

Here, in order to favorably cool the optical fiber, it is important to bring an entirely of the optical fiber in close contact with the heat sink and the holder and efficiently dissipate heat produced with the optical fiber. It is thus important to position the holder in a recessed part provided in the heat sink so that the surface of the holder is flush with the surface of the heat sink, and to bring the holder in close contact with the heat sink without any gaps.

However, when the holder is moved along the optical axis as aforementioned, a gap forms between the holder and the end face of the recessed part of the heat sink. When such a gap occurs, the optical fiber that passes through the gap portion is difficult to cool in part. The optical fiber in this gap portion thus becomes hot, and the output of laser light cannot be increased as a result.

A problem to be solved by certain implementations of the present invention lies in being able to efficiently cool an entirely of optical fiber in an optical fiber cooling device that enables the tip position of the optical fiber to be adjusted.

(1) An optical fiber cooling device according to a first aspect of the present invention is provided with a cooling base plate, a fiber holder, and an adjustment member. The cooling base plate has a recessed accommodating part. The fiber holder is disposed in the recessed accommodating part of the cooling base plate so as to be freely movable in a first direction. The fiber holder is for holding a tip part of the optical fiber on a surface thereof, and for adjusting a tip position of the held optical fiber in the first direction. The adjustment member is disposed in a gap between the fiber holder and an end face of the recessed accommodating part, is configured to have the optical fiber placed on a surface thereof, and is movable in the first direction by moving in a second direction that intersects the first direction. The adjustment member abuts against both the end face of the recessed accommodating part and an end face of the fiber holder.

Here, the tip part of the optical fiber is held in the fiber holder. Because the fiber holder is disposed so as to be freely movable on the cooling base plate, the distance from a lens or the like, for example, can be accurately adjusted. A gap may occur between the end face of the fiber holder and the end face of the recessed accommodating part of the cooling base plate in which the fiber holder is accommodated, in the case where the fiber holder is moved. In view of this, the adjustment member is disposed in the gap between both end faces, resulting in the fiber holder, the adjustment member and the cooling base plate being disposed so as to be abutted against each other without a gap. Accordingly, the optical fiber that is placed on the surfaces thereof will be efficiently cooled.

(2) In the optical fiber cooling device according to another aspect of the present invention, at least one of a first abutting part of the end face of the recessed accommodating part and the adjustment member and a second abutting part of the fiber holder and the adjustment member is constituted by contact between end faces that incline with respect to the first direction.

Here, a simple configuration enables the adjustment member to be moved in the first direction by being moved in the second direction.

(3) In the optical fiber cooling device according to another aspect of the present invention, the end face of the recessed accommodating part that abuts the adjustment member inclines with respect to the first direction. The adjustment member moves in the second direction by moving along the end face of the recessed accommodating part that inclines.

Here, similarly to the above, a simple configuration enables the adjustment member to be moved in the first direction by being moved in the second direction.

(4) In the optical fiber cooling device according to another aspect of the present invention, an entire bottom surface of both the fiber holder and the adjustment member contacts a surface of the recessed accommodating part.

Here, the heat of the optical fiber can be efficiently dissipated to the cooling base plate via the fiber holder and the adjustment member.

(5) In the optical fiber cooling device according to another aspect of the present invention, a surface of the fiber holder and a surface of the adjustment member are flush with a surface of the cooling base plate.

Here, the optical fiber can be easily brought in close contact with respective surfaces of the cooling base plate, the adjustment member and the fiber holder, enabling the optical fiber to be efficiently cooled.

(6) A laser oscillator according to a first aspect of the present invention is provided with an excitation light source, optical fiber for oscillation to which excitation light from the excitation light source is introduced and that outputs laser light, and the aforementioned optical fiber cooling device that cools the optical fiber for oscillation.

With certain implementations of the present invention such as described above, optical fiber can be efficiently cooled in an optical fiber cooling device that enables the tip position of the optical fiber to be adjusted.

Figure 8A:
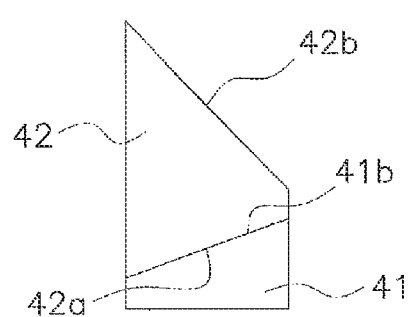
Figure 8B:
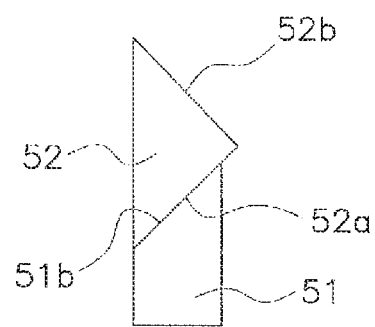

FIGS. 8(a) and 8(b) are schematic views showing a fiber holder and an adjustment member according to other embodiments of the present invention.

DETAILED DESCRIPTION

Configuration of Laser Oscillator

Figure 1:
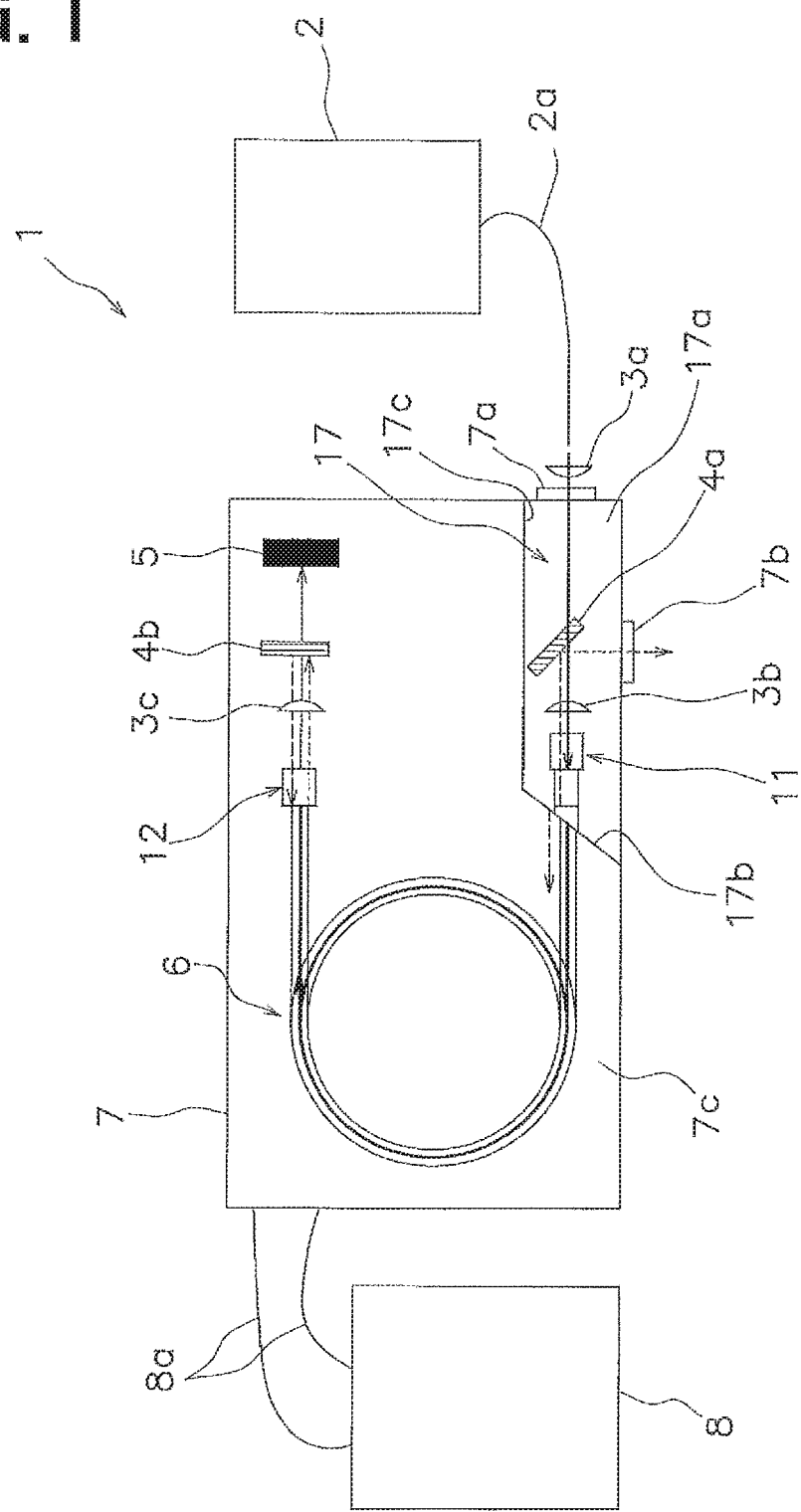
FIG. 1 is a schematic configuration diagram of a laser oscillator.

FIG. 1 is a schematic configuration diagram of a laser oscillator according to one embodiment of the present invention. A laser oscillator 1 is provided with an excitation light source 2, first to third lens 3a, 3b and 3c, first and second dichroic mirrors 4a and 4b, a damper 5, optical fiber 6, a cooling base plate 7, and a chiller device 8. Note that the cooling base plate 7 and the members mounted therein are accommodated in a casing which is not illustrated, and a configuration with the casing removed is shown in FIG. 1.

The excitation light source 2 is for oscillating excitation light, and can be constituted by a lamp or a semiconductor laser, for example. The excitation light oscillated by the excitation light source 2 is output via excitation light transmission fiber 2a.

The first lens 3a is a lens that functions as a collimating lens, and is disposed between the excitation light transmission fiber 2a and a first window part 7a of the cooling base plate 7 which will be discussed later. The first lens 3a is configured to convert excitation light generated by the excitation light source 2 from an diffused light state to a parallel light state.

The second lens 3b is a lens that functions as a condensing lens and a collimating lens, and is disposed between the first dichroic mirror 4a and a first end part 11 of the optical fiber 6. The second lens 3b is configured to condense and guide excitation light converted to a parallel light state by the first lens 3a to the optical fiber 6, and to convert laser light emitted from the optical fiber 6 to a parallel light state.

The third lens 3c is a lens that functions as a condensing lens and a collimating lens, and is disposed between the second dichroic mirror 4b and a second end part 12 of the optical fiber 6. The third lens 3c is configured to convert excitation light and laser light emitted from the optical fiber 6 to a parallel light state, and to condense and guide laser light reflected from the second dichroic mirror 4b to the optical fiber 6.

The first dichroic mirror 4a is disposed between the first lens 3a and the second lens 3b. The first dichroic mirror 4a is configured to transmit excitation light generated by the excitation light source 2, and to reflect and change the direction of travel of laser light emitted from the optical fiber 6.

The second dichroic mirror 4b is disposed between the third lens 3c and the damper 5. The second dichroic mirror 4b is configured to transmit excitation light emitted from the optical fiber 6, and to reflect laser light emitted from the optical fiber 6.

The damper 5 is disposed on the downstream side of the second dichroic mirror 4b, and is a member that absorbs excitation light transmitted through the second dichroic mirror 4b.

Optical Fiber 6

Figure 2:
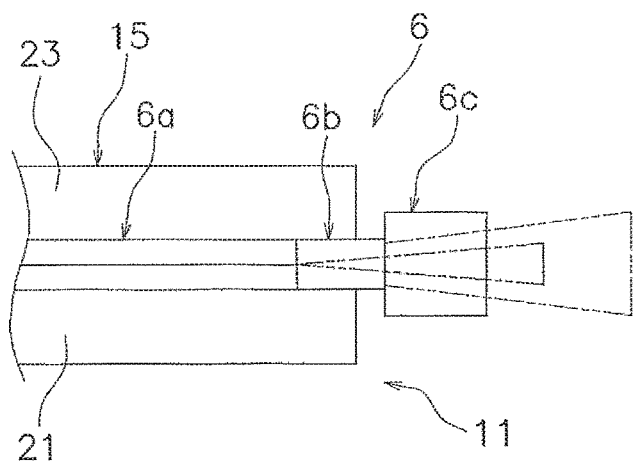
FIG. 2 is a cross-sectional view showing a first end part side of optical fiber.
Figure 3:
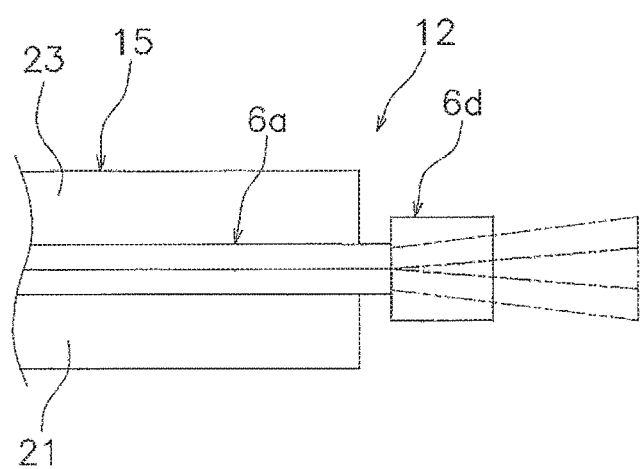
FIG. 3 is a cross-sectional view showing a second end part side of optical fiber.

FIG. 2 is a lateral cross-sectional view of the first end part 11 side of the optical fiber 6, and FIG. 3 is a lateral cross-sectional view of the second end part 12 side of the optical fiber 6. As shown in FIGS. 2 and 3, the optical fiber 6 has a first optical fiber main part 6a, a second optical fiber main part 6b, a first end cap 6c, a second end cap 6d, and a holding device 15.

The first optical fiber main part 6a is a portion that serves as the main body of the optical fiber 6, and laser light is generated in this first optical fiber main part 6a. The first optical fiber main part 6a has a first core and a first cladding formed so as to cover the first core. The first core is doped with a laser active material. The first cladding has a lower refractive index than the first core, and is not doped with a laser active material.

The first optical fiber main part 6a is heat-sealed at one end face to an end face of the second optical fiber main part 6b. The second optical fiber main part 6b has a second core and a second cladding formed so as to cover the second core. The second optical fiber main part 6b extends along the same axis as the first optical fiber main part 6a, and has substantially the same diameter as the diameter of the first optical fiber main part 6a. The second core is not doped with a laser active material, and thus does not generate heat even when excitation light is incident. That is, laser light is not generated in the second optical fiber main part 6b.

As shown in FIG. 2, the first end cap 6c is heat-sealed to the other end face of the second optical fiber main part 6b. The first end cap 6c has light transmittance for transmitting excitation light and laser light, and does not have deliquescence.

As shown in FIG. 3, the second end cap 6d is heat-sealed to the other end face of the first optical fiber main part 6a, and has the same configuration as the first end cap 6c.

Cooling Base Plate 7 and Chiller Device 8

The cooling base plate 7, as shown in FIG. 1, is formed in a rectangular parallelepiped shape in plan view, and has mounted thereon the second and third lenses 3b and 3c, the first and second dichroic mirrors 4a and 4b, the damper 5, and the optical fiber 6 that includes the holding device 15.

The cooling base plate 7 has the first window part 7a and a second window part 7b that have light transmittance. Excitation light generated by the light source 2 enters the cooling base plate 7 via the first window part 7a and is guided to the optical fiber 6. Laser light emitted from the optical fiber 6 is output to outside the cooling base plate 7 via the second window part 7b.

Also, the cooling base plate 7 has a recessed accommodating part 17 in a surface thereof, and has a channel 18 (refer to FIG. 5) through which coolant flows. The recessed accommodating part 17 has a surface 17a that is lower than a surface 7c of the cooling base plate 7 by a predetermined depth, and an inclined lateral surface 17b and a lateral surface 17c that are lateral walls. The inclined lateral surface 17b is formed to incline at a predetermined angle with respect to a direction (hereinafter, referred to as a first direction) in which an optical axis in an end part of the optical fiber 6 extends. The lateral surface 17c is formed parallel to the first direction. Since the holding device 15 is installed in this recessed accommodating part 17, the end part of the optical fiber 6 is cooled.

Note that the inside of the casing that accommodates the cooling base plate 7 and the like is filled with nitrogen. Also, in order to remove moisture inside the casing, a drying agent is placed inside in the casing.

The chiller device 8 is connected to the cooling base plate 7 via piping 8a. The chiller device 8 adjusts the temperature of the coolant that flows inside the cooling base plate 7. Specifically, the chiller device 8 cools coolant sent from the cooling base plate 7 via the piping 8a. Coolant cooled in the chiller device 8 is returned to the cooling base plate 7 via the piping 8a.

Holding Device 15

Figure 4:
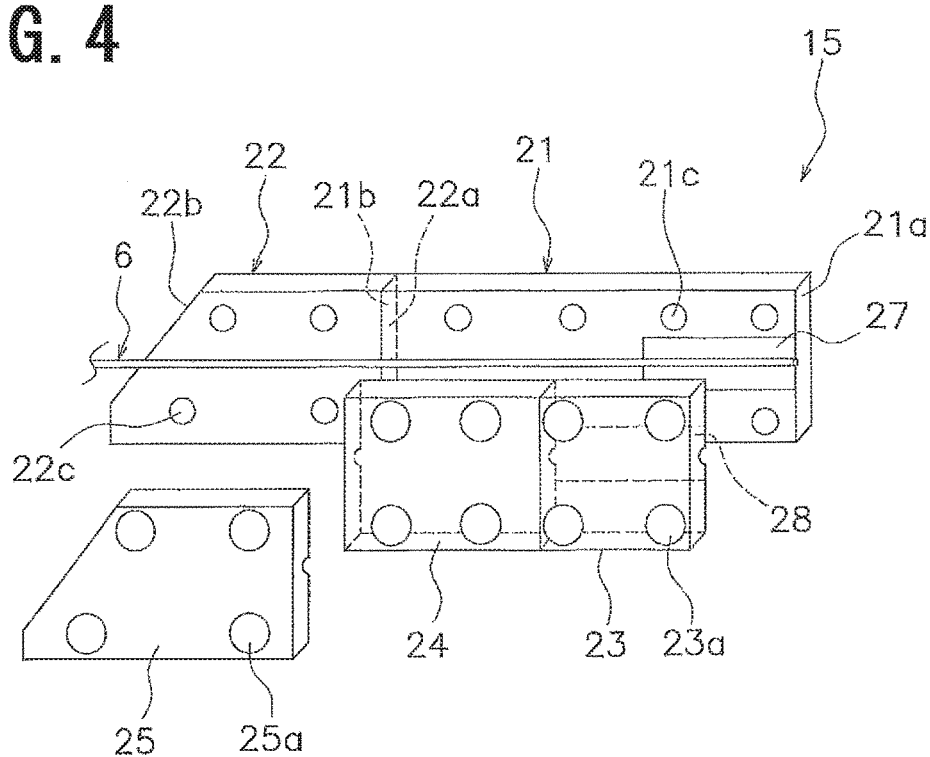
FIG. 4 is an external perspective view of a holding device.
Figure 5:
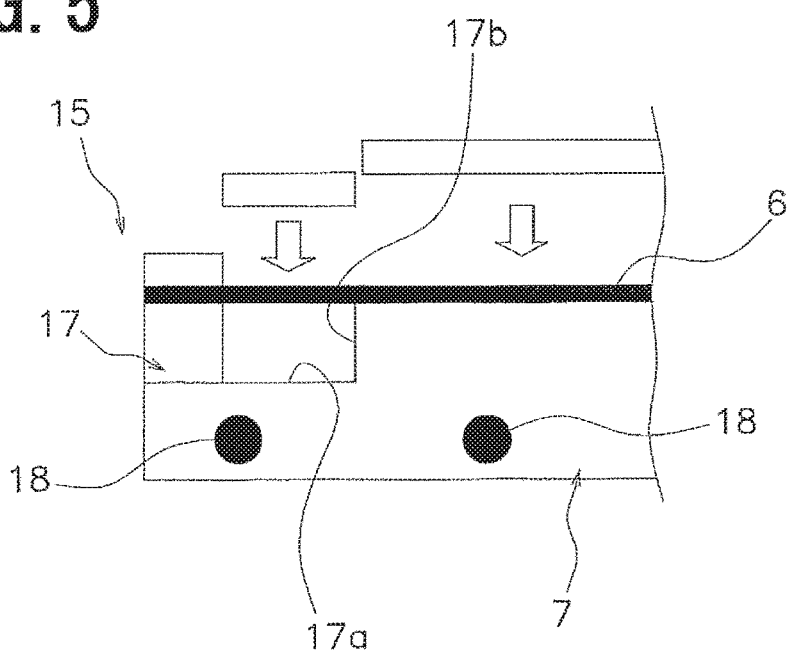
FIG. 5 is a cross-sectional view of a cooling device that includes the holding device.

FIG. 4 shows a perspective view of the holding device 15 provided in the first end part 11. Also, FIG. 5 shows a cross-sectional schematic view of the holding device 15. The holding device 15 has a function of holding the end part of the optical fiber 6 and a function of cooling the held end part. The holding device 15 has a fiber holder 21, an adjustment member 22, and first to third lid members 23, 24 and 25.

Note that, in this laser oscillator, the fiber cooling device is constituted by the cooling base plate 7, the chiller device 8, and the holding device 15.

The fiber holder 21 is a block-like member made of copper. A fiber groove for accommodating the optical fiber 6 is formed in one surface of the fiber holder 21, a heat conducting member 27 made of indium or the like is provided in a portion thereof. Also, both end faces 21a and 21b of the fiber holder 21 in the first direction are formed so as to be orthogonal to the first direction.

The first lid member 23 is attachable to the surface of the fiber holder 21. The surface of the first lid member 23 on the side that opposes the fiber holder 21 has formed therein a fiber groove for accommodating the optical fiber 6 and is provided with a heat conducting member 28 made of indium or the like. Also, four through holes 23a are formed in the first lid member 23, and four tap holes 21c are formed in the fiber holder 21 in positions corresponding to the through holes 23a of the first lid member 23.

The second lid member 24 is attachable to the surface of the fiber holder 21, and has a similar configuration to the first lid member 23, except for differing in size and a heat conducting member not being provided in the surface on the fiber holder 21 side.

The adjustment member 22 is accommodated in the recessed accommodating part 17 of the cooling base plate 7 together with the fiber holder 21. More specifically, the adjustment member 22 is disposed between the fiber holder 21 and the inclined lateral surface 17b of the recessed accommodating part 17. A fiber groove for accommodating the optical fiber 6 is formed in the surface of the adjustment member 22. Also, an end face 22a of the adjustment member 22 on the fiber holder 21 side is formed so as to be orthogonal to the first direction. The entire surface of this end face 22a is abuttable against the end face 21b of the fiber holder 21. Also, the end face 22b of the adjustment member 22 on the opposite side inclines with respect to the first direction. The angle of inclination of this inclined end face 22b is the same angle as the inclined lateral surface 17b of the recessed accommodating part 17. The entire surface of the inclined end face 22b of the adjustment member 22 is abuttable against the inclined lateral surface 17b of the recessed accommodating part 17.

The third lid member 25 has a similar shape to the adjustment member 22, and is attachable to the surface of the adjustment member 22. A fiber groove for accommodating the optical fiber 6 is formed in the surface of the third lid member 25 on the side that opposes the adjustment member 22. Also, four through holes 25a are formed in the third lid member 25, and four tap holes 22c are formed in the adjustment member 22 in positions corresponding to the through holes 25a of the third lid member 25.

A configuration such as the above enables the optical fiber 6 to be held in a state where the optical fiber 6 is sandwiched between the fiber holder 21 and the adjustment member 22 and the lid members 23 to 25, due to bolts (not shown) that pass through the through holes of the lid members 23, 24 and 25 being screwed into the tap holes of the fiber holder 21 and the adjustment member 22.

Also, the fiber holder 21 is movable along the optical axis (along the first direction), in order to adjust the distance between the tip of the optical fiber 6 and the second lens 3b. Also, the adjustment member 22 can be moved in the first direction, by moving the adjustment member 22 along the inclined lateral surface 17b of the recessed accommodating part 17. By moving the adjustment member 22 along the inclined lateral surface 17b after adjusting the position of the fiber holder 21 in the first direction, the gap between the end face 21b of the fiber holder 21 and the inclined lateral surface 17b of the recessed accommodating part 17 can thus be filled by the adjustment member 22.

The fiber holder 21 and the adjustment member 22 that have been positionally adjusted as abovementioned are fixed to the cooling base plate 7 by a suitable method that is not illustrated. For example, through holes need only be provided in the fiber holder 21 and the adjustment member 22, and these members need only be fixed with bolts in tap holes provided in the cooling base plate 7. In this case, by forming through holes provided in the fiber holder 21 as long holes along the first direction, and forming through holes provided in the adjustment member 22 as long holes along the inclined end face 22b, the fiber holder 21 can be fixed at suitable positions adjusted along the first direction, and the adjustment member 22 can be fixed at suitable positions adjusted along the inclined end face 22b (along the inclined lateral surface 17b).

Here, the thicknesses of the fiber holder 21 and the adjustment member 22 are set so that the surface of the fiber holder 21 and the surface of the adjustment member 22 are flush with the surface 7c of the cooling base plate 7, when these members are accommodated in the recessed accommodating part 17.

Note that, in this embodiment, a recessed accommodating part is not formed in the second end part 12 side of the cooling base plate 7. Also, the tip part of the optical fiber 6 is held by the fiber holder 21 and the lid member 23. The second end part 12 side may, of course, be configured similarly to the first end part 11 side.

Operations

The excitation light generated in the excitation light source 2 is output from the excitation light transmission fiber 2a, and converted to a parallel light state in the first lens 3a, before entering the recessed accommodating part 17 of the cooling base plate 7 via the first window part 7a. The excitation light that enters the recessed accommodating part 17 is transmitted through the first dichroic mirror 4a and condensed by the second lens 3b, before being incident on the optical fiber 6 from the first end part 11 of the optical fiber 6.

The excitation light that enters the optical fiber 6 propagates inside the first core of the first optical fiber main part 6a, and laser light is output due to excitation of the laser active material with which the first core is doped. Note that laser light is not output with the second core. Excitation light emitted from the second end part 12 of the optical fiber 6 is transmitted through the third lens 3c and the second dichroic mirror 4b, and is absorbed by the damper 5.

On the other hand, laser light generated within the first core of the first optical fiber main part 6a is emitted from the second end part 12 of the optical fiber 6 and converted to a parallel light state with the third lens 3c. The laser light is then reflected with the second dichroic mirror 4b and condensed with the third lens 3c, before being incident on the optical fiber 6 from the second end part 12 side. The laser light incident within the optical fiber 6 propagates inside the first core of the first optical fiber main part 6a, and is emitted from the first end part 11 of the optical fiber 6. The laser light is converted to a parallel light state by the second lens 3b and reflected by the first dichroic mirror 4a to change direction toward the second window part 7b, and is emitted outside the cooling base plate 7 via the second window part 7b.

In the above laser oscillation operation, particularly the first end part 11 of the optical fiber 6 to which excitation light is introduced becomes hot. In view of this, with the holding device 15 of the first end part 11, a configuration is adopted in which the fiber holder 21 is brought in close contact with the cooling base plate 7 via the adjustment member 22, and the heat generated at the end part of the optical fiber 6 is efficiently cooled.

Position Adjustment of Fiber Holder 21 and Setting of Adjustment Member 22

As aforementioned, the distance between the tip position of the optical fiber 6 and the second lens 3b needs to be accurately set. In view of this, the fiber holder 21 is moved along the optical axis direction (first direction) and the tip position of the optical fiber 6 is adjusted, after setting the optical fiber 6 in the fiber holder 21.

Figure 6:
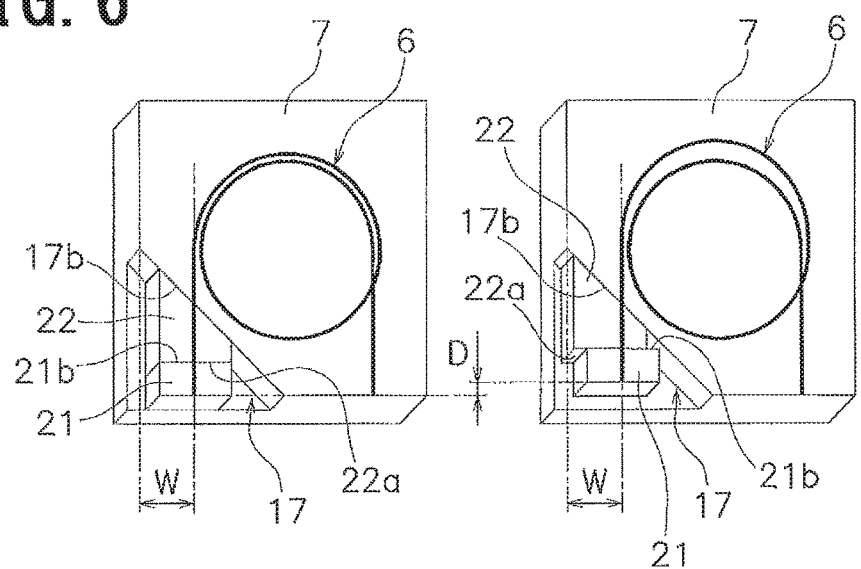
FIG. 6 is a schematic view illustrating an operation for adjusting the position of a fiber holder and an adjustment member.

For example, assume that the fiber holder 21 is initially set at a position such as shown on the right side of FIG. 6, and the distance from the second lens 3b is too large at this position. In this case, the fiber holder 21 needs to be moved to the second lens 3b side (in FIG. 6, adjustment width D). If the adjustment member 22 is left as is when the fiber holder 21 is moved to the second lens 3b side by the distance D, a gap occurs between the fiber holder 21 and the adjustment member 22. In such a state, the optical fiber 6 that is located over the gap between both members contacts neither the fiber holder 21 nor the adjustment member 22, and thus cannot be efficiently cooled.

In view of this, as shown on the left side of FIG. 6, the adjustment member 22 is moved to the right side in FIG. 6 along the inclined lateral surface 17b of the recessed accommodating part 17. This results in the adjustment member 22 also moving to the fiber holder 21 side together with moving to the right side in FIG. 6. The movement of the adjustment member 22 stops in a state where the end face 22a of the adjustment member 22 abuts against the end face 21b of the fiber holder 21, and the adjustment member 22 is fixed to the cooling base plate 7 at that position.

Adjustment such as the above results in the end part of the optical fiber 6 abutting, over its entirely, against the fiber holder 21 and the adjustment member 22, and also the surface of the cooling base plate 7. Accordingly, it is possible to efficiently dissipate the heat of the optical fiber 6, and to avoid the optical fiber 6 becoming hot.

Note that the position of the optical axis of the fiber holder 21 does not change, even due to the above adjustment.

That is, as shown in FIG. 6, a distance W from the end face of the cooling base plate 7 is the same before and after adjustment.

Other Embodiments

The present invention is not limited to an embodiment such as the above, and various modifications or corrections can be made without departing from the scope of the invention.

(1) In the above embodiment, the end face of the adjustment member on the fiber holder side is formed as a surface that is orthogonal to the first direction, but can be set to a suitable angle as long as the angle is not the same as the angle of inclination of the inclined end face on the opposite side. Specific examples regarding the shape of the adjustment member in this case are shown in FIGS. 7, 8(a) and 8(b).

Figure 7:
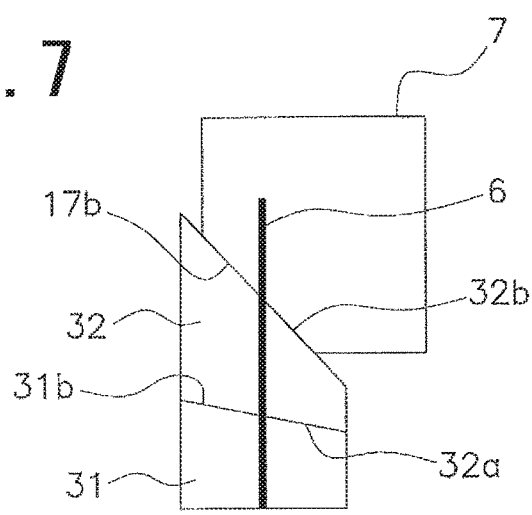
FIG. 7 is a schematic view showing a fiber holder and an adjustment member according to an another embodiment of the present invention.

In the example shown in FIG. 7, one end face 32a of an adjustment member 32 is inclined with respect to the optical axis direction (first direction), and the other end face 32b is also inclined in the same direction. Note that, as aforementioned, the angle of inclination of the one end face 32a differs from the angle of inclination of the other end face 32b. The other end face 32b has the same angle of inclination as the inclined lateral surface 17b of the recessed accommodating part 17 of the cooling base plate 7.

Note that, in the case of this example, an end face 31b of a fiber holder 31 on the side that contacts the adjustment member 32 is also formed to incline at a similar angle to the one end face 32a of the adjustment member 32.

Also, in the examples of FIGS. 8(a) and 8(b), one end faces 42a and 52a of adjustment members 42 and 52 are inclined with respect to the optical axis direction, and other end faces 42b and 52b are inclined in the opposite direction to the end faces 42a and 52a.

Note that, also in the case of the examples shown in FIGS. 8(a) and 8(b), similarly to the above, end faces 41b and 51b of fiber holders 41 and 51 on the side that contacts the adjustment members 42 and 52 are formed to incline at a similar angle to the one end faces 42a and 52a of the adjustment members 42 and 52.

(2) In the above embodiment, the surface of the fiber holder 21 and the surface of the adjustment member 22 were configured to be flush with the surface 7c of the cooling base plate 7, but there may be a difference in level between these surfaces.

(3) Although a cooling device that includes the holding device 15 was applied to a laser oscillator, the cooling device of certain implementations of the present invention can also be similarly applied to when holding and cooling optical fiber in other optical fiber devices.

(4) The configuration of optical fiber to be held is not limited to the above embodiment.

(5) Although the cooling base plate 7 was configured to have the channel 18 through which coolant flows, a configuration may be adopted in which the channel 18 is omitted and heat from the optical fiber 6 is dissipated to a fluid or a member that contacts an outer surface of the cooling base plate 7.

INDUSTRIAL APPLICABILITY

With certain implementations of the present invention, optical fiber can be efficiently cooled in an optical fiber cooling device that enables the tip position of the optical fiber to be adjusted.

The invention claimed is:

1. An optical fiber cooling device comprising:
a cooling base plate having a recessed accommodating part;
a fiber holder disposed in the recessed accommodating part of the cooling base plate so as to be freely movable in a first direction, and for holding a tip part of an optical fiber on a surface thereof and for adjusting a tip position of the held optical fiber in the first direction; and
an adjustment member disposed in a gap between the fiber holder and an end face of the recessed accommodating part, configured to have the optical fiber placed on a surface thereof, movable in the first direction by moving in a second direction that intersects the first direction, and abutting against both the end face of the recessed accommodating part and an end face of the fiber holder.

2. The optical fiber cooling device according to claim 1, wherein at least one of a first abutting part of the end face of the recessed accommodating part and the adjustment member and a second abutting part of the fiber holder and the adjustment member is constituted by contact between end faces that incline with respect to the first direction.

3. The optical fiber cooling device according to claim 2, wherein the end face of the recessed accommodating part that abuts against the adjustment member inclines with respect to the first direction, and
the adjustment member moves in the second direction by moving along the end face of the recessed accommodating part that inclines.

4. The optical fiber cooling device according to claim 1, wherein an entire bottom surface of both the fiber holder and the adjustment member contacts a surface of the recessed accommodating part.

5. The optical fiber cooling device according to claim 1, wherein a surface of the fiber holder and a surface of the adjustment member are flush with a surface of the cooling base plate.

6. A laser oscillator comprising:
an excitation light source;
an optical fiber for oscillation to which excitation light from the excitation light source is introduced and that outputs laser light; and
the optical fiber cooling device according to claim 1 that cools the optical fiber for oscillation.

* * * * *